United States Patent
Saito et al.

(10) Patent No.: US 8,547,001 B2
(45) Date of Patent: Oct. 1, 2013

(54) CERAMIC, PIEZOELECTRIC DEVICE, AND PRODUCTION METHOD THEREOF

(75) Inventors: Hiroshi Saito, Yokohama (JP); Takanori Matsuda, Chofu (JP); Kenji Takashima, Saitama (JP); Nobuhiro Kumada, Kofu (JP)

(73) Assignees: Canon Kabushiki Kaisha, Tokyo (JP); University of Yamanashi, Kofu-shi (JP)

(*) Notice: Subject to any disclaimer, the term of this patent is extended or adjusted under 35 U.S.C. 154(b) by 89 days.

(21) Appl. No.: 13/202,212

(22) PCT Filed: Mar. 30, 2010

(86) PCT No.: PCT/JP2010/056125
§ 371 (c)(1),
(2), (4) Date: Aug. 18, 2011

(87) PCT Pub. No.: WO2010/114148
PCT Pub. Date: Oct. 7, 2010

(65) Prior Publication Data
US 2011/0298336 A1 Dec. 8, 2011

(30) Foreign Application Priority Data
Mar. 31, 2009 (JP) ................. 2009-087240

(51) Int. Cl.
H01L 41/08 (2006.01)
(52) U.S. Cl.
USPC ........................................ 310/358; 292/62.9
(58) Field of Classification Search
USPC ............ 310/324, 328, 358, 357; 252/62.9 R, 252/62.9 PZ; 501/134; 29/25.35; 264/272.11
See application file for complete search history.

(56) References Cited

U.S. PATENT DOCUMENTS

| | | | |
|---|---|---|---|
| 6,093,338 A | 7/2000 | Tani et al. | |
| 7,348,715 B2 * | 3/2008 | Torii et al. | 310/358 |
| 7,477,004 B2 * | 1/2009 | Nanataki et al. | 310/358 |
| 7,586,234 B2 * | 9/2009 | Miyazawa et al. | 310/311 |

(Continued)

FOREIGN PATENT DOCUMENTS

| | | |
|---|---|---|
| EP | 2 028 663 A2 | 2/2009 |
| EP | 2145975 A2 | 1/2010 |

(Continued)

OTHER PUBLICATIONS

M. Q. Cai et al., "Giant Magneto-Optical Kerr Effects in Ferromagnetic Perovskite BiNi03 with Half-Metallic State," 112 J. Phys. Chem. 16638-16642 (Sep. 2008) (XP-002587462).

(Continued)

*Primary Examiner* — Thomas Dougherty
*Assistant Examiner* — Karen B Addison
(74) *Attorney, Agent, or Firm* — Fitzpatrick, Cella, Harper & Scinto

(57) ABSTRACT

To provide a piezoelectric ceramic containing $BiFeO_3$ having a {110} plane orientation in a pseudo-cubic form, which is suited for the domain engineering, the piezoelectric ceramic includes a perovskite-type metal oxide represented by the following general formula (1), and has a {110} plane orientation in a pseudo-cubic form:

$$xBiFeO_3\text{-}(1-x)ABO_3 \qquad \text{General Formula (1)}$$

where A and B each represent one kind or more of metal ions; A represents a metal ion having a valence of 1, 2 or 3; and B represents a metal ion having a valence of 3, 4, or 5, provided that x is within a range of $0.3 \le x \le 1$.

6 Claims, 6 Drawing Sheets

(56) References Cited

U.S. PATENT DOCUMENTS

| | | |
|---|---|---|
| 2007/0241642 A1 | 10/2007 | Miyazawa et al. |
| 2008/0067898 A1 | 3/2008 | Aoki et al. |
| 2008/0206561 A1 | 8/2008 | Yokoyama et al. |
| 2008/0248277 A1 | 10/2008 | Yokoyama et al. |
| 2009/0170686 A1 | 7/2009 | Yura et al. |
| 2009/0185971 A1 | 7/2009 | Yokoyama et al. |
| 2009/0189489 A1 | 7/2009 | Yura et al. |
| 2009/0236946 A1 | 9/2009 | Yura et al. |
| 2009/0239041 A1 | 9/2009 | Yura et al. |
| 2010/0025617 A1 | 2/2010 | Kubota et al. |
| 2010/0208412 A1 | 8/2010 | Takashima et al. |
| 2011/0221302 A1 | 9/2011 | Yabuta et al. |

FOREIGN PATENT DOCUMENTS

| | | |
|---|---|---|
| JP | 2007-287745 A | 11/2007 |
| JP | 2008-037064 A | 2/2008 |
| WO | 2008/105290 A1 | 9/2008 |

OTHER PUBLICATIONS

S. Leontsev et al., "Dielectric and Piezoelectric Properties in Mn-modified (1-x)BiFeO3-xBaTiO3 Ceramics," Chem Abstract AN—2009:1543755 (Journal of the American Ceramic Society (2009), 92 (12), 2957-2961) (2009) (XP-002587463).

Satoshi Wada et al. "Preparation of [110] Grain Oriented Barium Titanate Ceramics by Templated Grain Growth Method and Their Piezoelectric Properties," 46(10B) Jap. J. Appl. Phys. 7039-7043 (2007).

Office Action in Chinese Application No. 201080015258.9 (dated Mar. 5, 2013).

Office Action in Korean Patent Application No. 10-2011-7024927 (mailed Dec. 22, 2012).

Examination Report in European Application No. 10715365.2 (dated Feb. 20, 2013).

* cited by examiner

US 8,547,001 B2

CERAMIC, PIEZOELECTRIC DEVICE, AND PRODUCTION METHOD THEREOF

TECHNICAL FIELD

The present invention relates to a piezoelectric ceramic, a piezoelectric device, and a production method thereof, and more particularly, to a lead-free piezoelectric ceramic and a piezoelectric device using the same, and a production method of the piezoelectric device.

BACKGROUND ART

Many of the piezoelectric ceramics, which are used for piezoelectric devices which are utilized for a ultrasonic motor, an inkjet head, and the like, are materials so called PZT, and are oxides including lead (Pb), zirconium (Zr), and titan (Ti). For that reason, from environmental problems, developments of piezoelectric ceramics, which does not contain lead (lead-free piezoelectric ceramics), are being proceeded.

Piezoelectric constant of the lead-free piezoelectric ceramics is low compared to that of PZT, and is not sufficient. For this reason, the lead-free piezoelectric ceramic is subjected to domain engineering, whereby the piezoelectric is improved (S. Wada, Japanese Journal of Applied Physics, Vol. 46, No. 10B, 2007, p. 7039-7043). For the domain engineering described above, there is needed a perovskite-type piezoelectric ceramic, which has a {110} plane orientation in a pseudo-cubic form.

$BiFeO_3$ has an extremely large amount of remanent polarization, and is also high in Curie point. As a result, the perovskite-type piezoelectric material containing $BiFeO_3$ is a promising piezoelectric material. For example, there is exemplified a thin-film piezoelectric material in which $BiFeO_3$ and $BaTiO_3$ are dissolved (Japanese Patent Application Laid-Open No. 2007-287745). However, in the perovskite-type piezoelectric materials containing $BiFeO_3$, there has never been provided a perovskite-type piezoelectric ceramic, which is oriented and is suitable for the domain engineering. The reason resides in that, if a substrate, on which a thin film is to be grown, is appropriately selected, it is easy to attain the orientation in a specific direction, whereas, in a case of a ceramic, because there is not provided a substrate for supporting the orientation, it is difficult to attain the orientation.

For this reason, as a method of aligning a ceramic, there is known a magnetic field orientation (Japanese Patent Application Laid-Open No. 2008-037064). Japanese Patent Application Laid-Open No. 2008-037064 discloses a method involving adding an additive having strong magnetic anisotropy to apply a magnetic field in order to subject the perovskite-type piezoelectric material having small magnetic anisotropy to the orientation by the magnetic field. However, for the orientation by the magnetic field, if an additive having strong magnetic anisotropy is added, the electric characteristics are adversely affected, which is not desirable. Furthermore, the perovskite-type piezoelectric material described in Japanese Patent Application Laid-Open No. 2008-037064 has a {100} plane orientation in the pseudo-cubic form, which is unsuitable orientation for the domain engineering.

The present invention has been made in view of the above-mentioned circumstances, and is aimed to provide a piezoelectric ceramic containing $BiFeO_3$, which is suitable for domain engineering.

Furthermore, the present invention provides a piezoelectric device using the above-mentioned piezoelectric ceramic, and a production method of the piezoelectric device.

DISCLOSURE OF THE INVENTION

The piezoelectric ceramic capable of solving the above-mentioned objects is a ceramic made of a perovskite-type metal oxide represented by the following general formula (1), and has a {110} plane orientation in a pseudo-cubic form:

$xBiFeO_3$-$(1-x)ABO_3$     General Formula (1)

where A and B each represent one kind or more of metal ions; A represents a metal ion having a valence of 1, 2 or 3; B represents a metal ion having a valence of 3, 4, or 5, provided that x is within a range of $0.3 \le x \le 1$.

The piezoelectric device capable of solving the above-mentioned objects includes a pair of electrodes provided so as to sandwich the piezoelectric ceramic.

Furthermore, the production method of a piezoelectric device capable of solving the above-mentioned objects includes:

the slurry step of obtaining a ceramic slurry comprising a ceramic powder made of a perovskite-type metal oxide represented by the following general formula (1);

the orientation step of forming the ceramic slurry in a magnetic field to obtain an oriented ceramic compact body;

the sintering step of sintering the ceramic compact body to obtain a ceramic sintered body; and the electrode formation step of forming a pair of electrodes so as to sandwich the ceramic sintered body, in which the ceramic powder in the slurry step contains 30 mol % or more of $BiFeO_3$ which is dissolved or mixed:

$xBiFeO_3$-$(1-x)ABO_3$     General Formula (1)

where A and B each represent one kind or more of metal ions; A represents a metal ion having a valence of 1, 2 or 3; and B represents a metal ion having a valence of 3, 4, or 5, provided that x is within a range of $0.3 \le x \le 1$.

According to the present invention, there may be provided a ceramic containing $BiFeO_3$ having a {110} plane orientation in a pseudo-cubic form, which is suited for the domain engineering ceramic.

Further features of the present invention will become apparent from the following description of exemplary embodiments with reference to the attached drawings.

BEST MODE FOR CARRYING OUT THE INVENTION

Figure 1A:
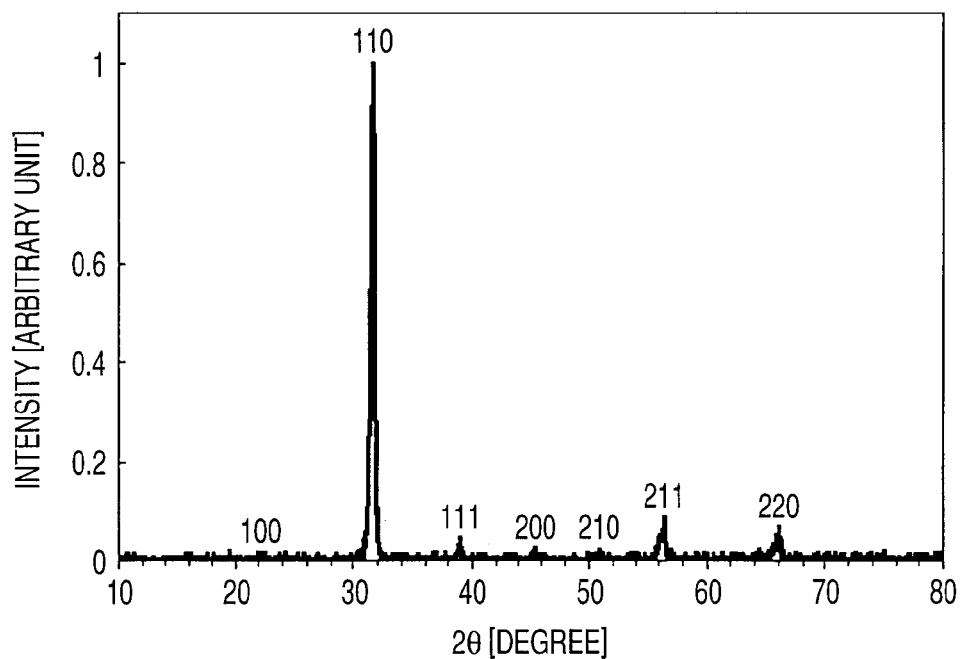
FIGS. 1A and 1B are graphs illustrating an X-ray diffraction (XRD) of an oriented sintered body and the non-oriented sintered body (Example 1 and Comparative Example 3)

Hereinafter, embodiments of the present invention are described in detail.

A piezoelectric ceramic according to the present invention relates to a ceramic made of a perovskite-type metal oxide represented by the following general formula (1), and has a {110} plane orientation in a pseudo-cubic form:

$x\text{BiFeO}_3\text{-}(1-x)\text{ABO}_3.$   General Formula (1)

In the general formula (1), A and B each represent one kind or more of metal ions; A represents a metal ion having a valence of 1, 2 or 3; B represents a metal ion having a valence of 3, 4, or 5.

It should be noted that, when A or B is formed of a plurality of metal ions, in a case where A is a metal ion having an average valence of 2, B is a metal ion having an average valence of 4; in a case where A is a metal ion having an average valence of 3, B is a metal ion having an average valence of 3; and in a case where A is a metal ion having an average valence of 1, B is a metal ion having an average valence of 5.

Here, the average of the valence is a value obtained by multiplying the valences of the plurality of metal ions with component ratios of the respective metal ions. For example, in a case where a metal ion having a valence of 2 and a metal ion having a valence of 4 are combined together at a ratio of 0.5:0.5, the average of the valence becomes 3.

As specific examples of the metal ion of A, in a case of one kind of metal ion, if a metal ion having a valence of 1 is defined as A1, A1=Li, Na, K, Ag. Similarly, if a metal ion having a valence of 2 is defined as A2, A2=Ba, Sr, Ca. Similarly, if a metal ion having a valence of 3 is defined as A3, A3=Bi, La, Ce, Nd. In a case where the average of the valences of the plurality of metal ions is 1, $A1_xA1_{1-x}$ (0<x<1) is established. Similarly, in a case where the average of the valence is 2, $A2_xA2_{1-x}$ (0<x<1) and $A1_{1/2}A3_{1/2}$ are established. In a case where the average of the valence is 3, $A3_xA3_{1-x}$ (0<x<1) is established. As a specific example of the metal ion of B, in a case of one kind of metal ion, if a metal ion having a valence of 3 is defined as B3, B3=Mn, Sb, Al, Yb, In, Fe, Co, Sc, Y, Sn. Similarly, if a metal ion having a valence of 4 is defined as B4, B4=Ti, Zr. Similarly, if a metal on having a valence of 5 is defined as B5, B5=Nb, Sb, Ta. In a case where the average of the valences of the plurality of metal ions is 3, $B3_xB3_{1-x}$ (0<x<1) and $B2_{1/2}B4_{1/2}$ and $B2_{2/3}B5_{1/3}$ and $B2_{3/4}B6_{1/4}$ and $B1_{1/3}B4_{2/3}$ and $B1_{1/2}B5_{1/2}$ and $B1_{3/5}B6_{2/5}$ are established. However, B1 is a metal ion having a valence of 1, and B1=Cu. B2 is a metal ion having a valence of 2, and B2=Mg, Ni, Zn, Co, Sn, Fe, Cd, Cu, Cr. B6 is a metal ion having a valence of 6, and B6=W, Te, Re. In a case where the average of the valences of the plurality of metal ions is 4, $B4_xB4_{1-x}$ (0<x<1) and $B3_{1/2}B5_{1/2}$ and $B3_{2/3}B6_{1/3}$ and $B2_{1/3}B5_{2/3}$ and $B2_{1/2}B6_{1/2}$ and $B1_{1/4}B5_{3/4}$ and $B1_{2/5}B6_{3/5}$ are established. In a case where the average of the valences of the plurality of metal ions is 5, $B5_xB5_{1-x}$ (0<x<1) and $B4_{1/2}B6_{1/2}$ and $B3_{1/3}B6_{2/3}$ and $B2_{1/4}B6_{3/4}$ and $B1_{1/5}B6_{4/5}$ are established.

In the general formula (I), $ABO_3$ is a perovskite-type ceramic, and examples thereof include $BaTiO_3$, $KNbO_3$, $NaNbO_3$, $LiNbO_3$, $LiTaO_3$, $AgNbO_3$, $BiCrO_3$, $BiMnO_3$, $BiCoO_3$, $(Bi0.5Na0.5)TiO_3$, $(Bi0.5K0.5)TiO_3$, $Bi(Zn0.5Ti0.5)O_3$. Of those, two kinds or more may be dissolved. More preferably, there are exemplified $BaTiO_3$, $BiCoO_3$, $(Bi0.5K0.5)TiO_3$, and $Bi(Zn0.5Ti0.5)O_3$, which may form the morphotropic phase boundary (MPB) with $BiFeO_3$.

A symbol x is within a range of 0.3≤x≤1, preferably 0.5≤x≤0.9.

The piezoelectric ceramics according to the present invention has a {110} plane orientation in the pseudo-cubic form.

Note that, hereinafter, to a crystal (Miller) index of a case where the crystal system is presumed as a pseudo cubic, a cubic is added. The pseudo cubic represents a unit cell which is slightly warped than the cubic system. For example, to have a {hkl} plane orientation in the pseudo-cubic form is expressed as (hkl) cubic orientation.

The piezoelectric ceramic including $x\text{BiFeO}_3\text{-}(1-x)\text{ABO}_3$ according to the present invention has a feature to have a (110) cubic orientation. Here, to have a (110) cubic orientation means that a Lotgering factor F of a {110} plane in the pseudo-cubic form by the Lotgering method is 10% or more and 100% or less, preferably 15% or more and 100% or less, and further preferably 50% or more and 100% or less. Because, if the Lotgering factor F is lower than 10%, there is substantially no difference in characteristics with non-orientation.

A calculating method for the Lotgering factor F uses a peak strength of X-ray diffracted from a target crystal surface, and is calculated by the following Expression 1.

$$F=(\rho-\rho_0)/(1-\rho_0) \qquad \text{(Expression 1)}$$

Here, $\rho_0$ is calculated using an X-ray diffraction intensity ($I_0$) of a non-orientation sample, and in a case of a (110) cubic orientation, $\rho_0$ is calculated as a ratio of a sum of a diffraction of {110} cubic plane with respect to a sum of a total diffraction intensity, by the following Expression 2.

$$\rho_0=\Sigma I_0\{110\}\text{cubic}/\Sigma I_0\{hkl\}\text{cubic} \qquad \text{(Expression 2)}$$

A symbol $\rho$ is calculated using an X-ray diffraction intensity (I) of an orientation sample, and in the case of the (110) cubic orientation, $\rho_0$ is calculated as a ratio of a sum of a diffraction of {110} cubic plane with respect to a sum of a total diffraction intensity, by the following Expression 3 as in the above-mentioned Expression 2.

$$\rho=\Sigma I\{110\}\text{cubic}/\Sigma I\{hkl\}\text{cubic} \qquad \text{(Expression 3)}$$

In order to subject the ceramic to the domain engineering, it is required that the polarization direction and the orientation direction be different from each other. $BiFeO_3$ has the crystal system of rhombohedral crystal, and the polarization direction is a <111> cubic direction.

Accordingly, if a piezoelectric ceramic including $x\text{BiFeO}_3\text{-}(1-x)\text{ABO}_3$ having a (110) cubic orientation may be obtained, as the polarization direction and the orientation direction differs from each other, thereby being suited for the domain engineering.

Furthermore, the thickness of the piezoelectric ceramic of the present invention is 50 μm or more, and preferably 100 μm or more.

The piezoelectric device according to the present invention has such a feature of including the above-mentioned ceramic and a pair of electrodes provided so as to sandwich the ceramic.

It is preferred that the electrodes be provided in parallel with the {110} orientation plane in the pseudo-cubic form.

Furthermore, the production method of a piezoelectric device according to the present invention includes:

the slurry step of obtaining a ceramic slurry including a ceramic powder made of a perovskite-type metal oxide represented by the above-mentioned general formula (1);

the orientation step of forming the ceramic slurry in a magnetic field to obtain an oriented ceramic compact body;

the sintering step of sintering the ceramic compact body to obtain a ceramic sintered body; and the electrode formation step of forming a pair of electrodes so as to sandwich the ceramic sintered body, in which the ceramic powder in the slurry step contains 30 mol % or more of $BiFeO_3$ which is dissolved or mixed, and a direction of the magnetic field in the orientation step is identical with a normal direction of the electrodes in the electrode formation step.

Hereinafter, description is made of the production method of a piezoelectric device according to the present invention.

First, in the slurry step, the ceramic slurry including the ceramic powder made of the perovskite-type metal oxide represented by $xBiFeO_3$-$(1-x)ABO_3$ is obtained.

The slurry step is a step in which, in order to subject the ceramic powder to the orientation by the magnetic field, the ceramic powder is dispersed in a solvent to form a slurry. The average particle diameter of the ceramic powder is, in order to facilitate the orientation by the magnetic field, 50 nm or more and 30 µm or less, preferably 100 nm or more and 10 µm or less. In the orientation by the magnetic field, it is necessary that the orientation energy by the magnetic field be larger than the thermal energy of Brown movement of a slurry solution. The orientation energy by the magnetic field is proportional with a mass of a unit particle, and the thermal energy is proportional with a surface area of the unit particle. Therefore, if the particle diameter of the ceramic powder is smaller than 50 nm, the thermal energy of the Brown movement, which is proportional with the surface area, becomes dominant, and hence the orientation by the magnetic field is inhibited, which is not desirable. On the other hand, if the particle diameter becomes larger than 30 µm, the grain diameter size of the sintered body becomes larger, and hence its mechanical strength is lowered, which is not desirable.

The shape of the ceramic powder is preferably isotropic, and for example, spherical is desired. If the ceramic powder has anisotropy, the density of the compact body is lowered, thereby being difficult in sintering. As a result, the density of the sintered body is lowered, which is not desirable.

A dispersing material for the slurry is preferably dissipated through sintering so as not to degrade electric characteristics thereof, and for example, polycarbonic acid-ammonium salt is preferred.

About the solvent for the slurry, water, or ethanol is preferred.

The solid concentration of the slurry is preferably 30 wt % or more and 90 wt % or less. If the solid concentration of the slurry is more than 90 wt %, as a dispersing state of the slurry is not good, the orientation by the magnetic field is inhibited, which is not desirable. On the other hand, if the solid concentration is less than 30 wt %, it is impossible to obtain a sufficient compact body density in the formation step, which is not desirable.

To the slurry, in addition to a dispersing material, a binder may be added to enhance the strength of the compact body. In addition, to the slurry, a sintering aid for promoting the sintering of the sintered body may be added, and for example, there is exemplified CuO, or the like.

Next, through the orientation step, the ceramic slurry is formed under the magnetic field, to thereby obtain an oriented ceramic compact body. The orientation step is a step in which the slurry in the slurry step is subjected to the magnetic field to be formed, to thereby obtain an oriented compact body.

In general, it is hard to subject the perovskite-type piezoelectric ceramic to orientation by the magnetic field. The reason resides in that, to conduct the orientation by the magnetic field, magnetic anisotropy is necessary, but the general perovskite-type piezoelectric ceramic has extremely small magnetic anisotropy. Even if the general perovskite-type piezoelectric ceramic may be oriented by the magnetic field, it is impossible to differ the polarization direction and the orientation direction from each other so as to be suited for the domain engineering. This is because, in the general perovskite-type piezoelectric ceramic, the polarization direction and the direction of the magnetic anisotropy are identical, and hence if the general perovskite-type piezoelectric ceramic is oriented by the magnetic field, the orientation occurs in the polarization direction.

A mechanism of the orientation by the magnetic field is described with reference to FIG. 6 and FIGS. 7A and 7B.

Figure 6:
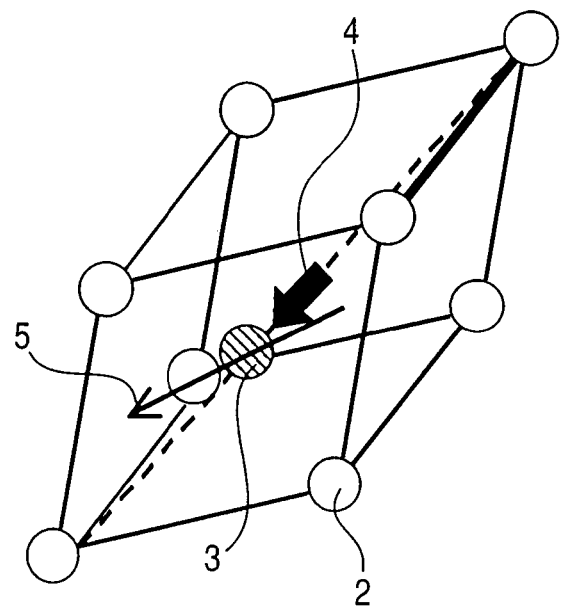
FIG. 6 is a schematic diagram illustrating a polarization direction and a spin direction of $BiFeO_3$.

FIG. 6 is a schematic diagram illustrating the polarization direction and the spin direction of $BiFeO_3$. $BiFeO_3$ is a multiferroic material having ferroelectricity and antiferromagnetism together. As illustrated in FIG. 6, a polarization direction 4 of $BiFeO_3$ is a <111> cubic direction. Contrary to this, the direction of the electronic spin is, as illustrated by a spin direction 5 of Fe atom of $BiFeO_3$, a [110] cubic direction. For that reason, though the polarization direction of $BiFeO_3$ is the <111> cubic direction, the direction of the magnetic anisotropy becomes the [110] cubic direction. As a result, the application of the magnetic field causes the (110) cubic orientation. As described above, in $BiFeO_3$, different from the general perovskite-type piezoelectric ceramics, the polarization direction differs from the direction of the orientation by the magnetic field.

Next, an orientation step is described.

Figure 7A:
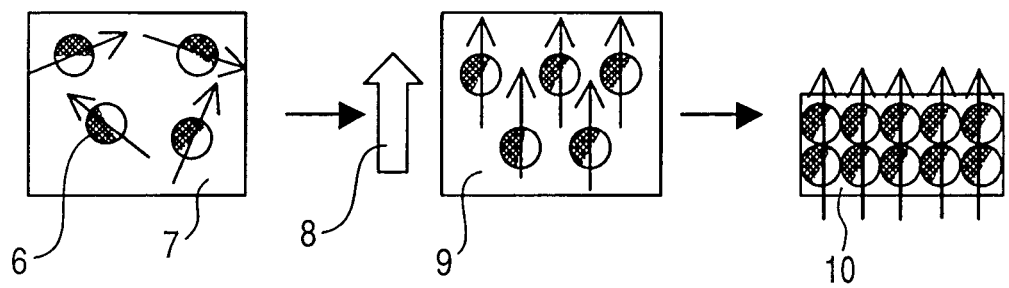
FIGS. 7A and 7B are schematic diagrams illustrating orientation processes by the magnetic field.
Figure 7B:
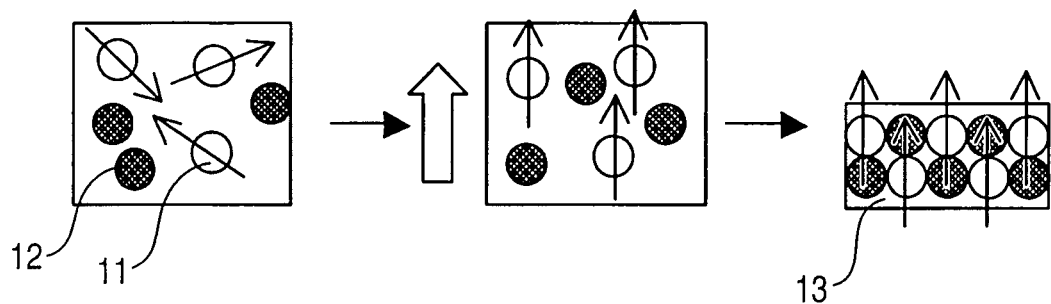

FIGS. 7A and 7B schematic diagrams illustrating a orientation process by the magnetic field of a case where $BiFeO_3$ and the perovskite-type piezoelectric ceramic are dissolved or mixed. In FIGS. 7A and 7B, the compact powder 6 contains $BiFeO_3$ and the perovskite-type piezoelectric ceramic dissolved therein, and reference numeral 7 denotes a slurry; 8, a magnetic field; and 9, a slurry oriented by the magnetic field. A compact body 10 contains the ceramic powder in which $BiFeO_3$ is dissolved orientation, and reference numeral 11 denotes a ceramic powder of $BiFeO_3$; 12, a ceramic powder of a perovskite-type piezoelectric ceramic $ABO_3$; and 13, a compact body in which mixed ceramic powder is oriented.

First, description is made of an orientation step of a case where $BiFeO_3$ is dissolved in the perovskite-type piezoelectric ceramic $ABO_3$.

The inventors of the present invention have made intensive investigations, and as a result, found that 30 mol % or more of $BiFeO_3$ is contained therein, the perovskite-type piezoelectric ceramic, which is hard to be oriented by the magnetic field, may have a (110) cubic orientation suited for the domain engineering.

A step of the orientation process by the magnetic field of this case is illustrated in FIG. 7A.

FIG. 7A is a schematic diagram of a orientation process by the magnetic field for the ceramic powder in which $BiFeO_3$ and the perovskite-type piezoelectric ceramic are dissolved. In FIG. 7A, $BiFeO_3$ and the perovskite-type piezoelectric ceramic $ABO_3$ are subjected to calcination, and the ceramic powder 6 which is dissolved is formed into the slurry 7. If the magnetic field 8 is applied to the slurry 7, as illustrated by reference numeral 9, the orientation occurs in the slurry owing to the magnetic anisotropy. This state is maintained to conduct the formation, thereby being capable of obtaining the oriented compact body 10.

Now, the orientation mechanism of this case is described. A magnitude of the magnetic anisotropy per unit of $BiFeO_3$ is larger by about 100 times compared to $BaTiO_3$, which being a typical perovskite-type piezoelectric ceramic. Accordingly, in a case where $BiFeO_3$ is dissolved in the perovskite-type piezoelectric ceramic, the magnetic anisotropy may be enlarged, thereby occurring the orientation by the magnetic field. However, if the content of $BiFeO_3$ is reduced to less than 30 mol %, the magnetic anisotropy is degraded. As a result, the thermal energy of the Brown movement becomes dominant than the orientation energy by the magnetic field, and hence the orientation is markedly degraded.

Next, description is made of an orientation step of a case where $BiFeO_3$ is mixed with the perovskite-type piezoelectric ceramic $ABO_3$. FIG. 7B is a schematic diagram illustrating the orientation process by the magnetic field of a case where $BiFeO_3$ and the ceramic powder of the perovskite-type piezoelectric ceramic.

In the process of the orientation by the magnetic field, as illustrated in FIG. 7B, $BiFeO_3$ 11 and the perovskite-type piezoelectric ceramic $ABO_3$ 12 are mixed to obtain the slurry. After that, similar to a case where $BiFeO_3$ and the perovskite-type piezoelectric ceramic $ABO_3$ are dissolved, the orientation by the magnetic field is caused to occur, to thereby obtain an oriented compact body 13.

The orientation mechanism of this case is described. The general perovskite-type ceramic is sintered at high temperatures of from 1200° C. to 1500° C. Contrary to this, $BiFeO_3$ has an easy sintering property such as being sintered at a low temperature of about 800° C. This means that a grain growth rate of $BiFeO_3$ is considerably higher than the general perovskite-type ceramic. For that reason, in a case where $BiFeO_3$ and a general perovskite type ceramic are mixed to cause the orientation by the magnetic field to occur, as in the compact body 13 of FIG. 7B, only $BiFeO_3$ conducts the (110) cubic orientation. However, in the sintering, the grain growth of $BiFeO_3$ having a considerably higher grain growth rate than the general perovskite-type piezoelectric ceramic $ABO_3$ becomes dominant, thereby being available of a sintered body having the (110) cubic orientation. However, if the content of $BiFeO_3$ becomes less than 30 mol %, even though the grain growth rate of $BiFeO_3$ is higher, influences of the perovskite-type piezoelectric ceramic having no (110) cubic orientation, which occupies a large numbers, become extremely larger, thereby degrading a degree of the orientation.

Furthermore, the average particle diameter of the perovskite-type piezoelectric ceramic powder when mixing is desirably 80% or less of $BiFeO_3$. Because, if the average particle diameter of the perovskite-type piezoelectric ceramic powder is larger than 80% of $BiFeO_3$ powder, the orientation of $BiFeO_3$ powder by the magnetic field may be inhibited, resulting in degradation of the degree of orientation.

With the above-mentioned mechanism, if 30 mol % or more of $BiFeO_3$ is contained, there may be obtained a piezoelectric ceramic having the (110) cubic orientation by the orientation process by the magnetic field.

In the orientation step, there may be employed as a formation method a method which does not inhibit rotations of ceramic particles by the magnetic field. Furthermore, as suitable methods, there are given a doctor blade method, a casting method, and an electrophoresis. As a mold for casting, a plaster mold and a porous alumina mold may be used.

As the strength of the magnetic field in the orientation step is strong as possible, the orientation energy becomes higher, and hence 0.5 T or more is preferred. The strength is more preferably 1 T or more, and further more preferably, 10 T or more and 12 T or less.

Next, the sintering step of sintering the ceramic compact body to obtain a ceramic sintered body is carried out.

The sintering step is a step for heating the compact body obtained in the orientation step to be sintered. A sintering temperature may be optimally selected depending on its composition, and its preferred range is from 700° C. to 1500° C. Preferably, the average grain diameter of the sintered body is 50 μm or less. If the average grain diameter is larger than 50 μm, a mechanical strength of the sintered body is degraded. The relative density of the sintered body is 80% or more, preferably 85% or more, and further more preferably 87% or more. The reason resides in that, if the relative density is smaller than 80%, a specific dielectric constant of the sintered body is markedly degraded and the mechanical strength is also degraded.

The ceramic sintered body is a piezoelectric ceramic of the present invention.

Next, an electrode formation step of forming a pair of the electrodes while sandwiching the piezoelectric ceramic formed of the ceramic sintered body.

The electrode formation step is a step involving polishing the sintered body obtained in the sintering step, and forming the electrodes. In the polishing, a surface having a direction of the magnetic field in the orientation step as the normal direction may only be formed. For example, it is preferred that the polishing be performed by finding out an orientation axis by a back Laue method. Thus, carrying out the polishing, and forming a surface having the orientation axis found enables the enhancement of the degree of orientation. In the casting, the orientation of the ceramic by the magnetic field is inhibited on the contact surface with the plaster mold, resulting in a low degree of orientation. Accordingly, the polishing is performed by 50 μm or more, and more preferably 100 μm or more. After the polishing, the electrodes may be formed by sputtering or by sintering of a silver paste. As the electrode material, silver, gold, platinum, or the like is preferred. Between the electrodes and the piezoelectric ceramic, there may be provided a close contact layer made of Ti, $TiO_2$, Cr, or the like.

Figure 8:
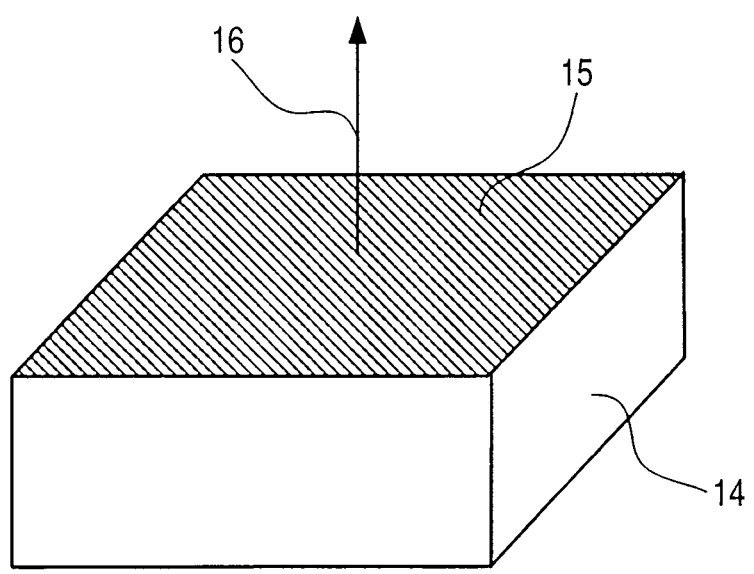
FIG. 8 is an example of the piezoelectric device of the present invention and a diagram illustrating a positional relationship between an electrode surface and a direction of a magnetic field of the sintered body of the present invention.

Furthermore, it is preferred that the direction of the magnetic field in the orientation step be identical with a normal direction of the electrodes in the electrode formation step. By referring to FIG. 8, description is made of the positional relation between the direction of the magnetic field and the direction of the normal direction of the electrodes. It is preferred that the normal line of the electrodes 15 formed on both sides of the sintered body 14 and the direction of the magnetic field 16 be identical as illustrated in FIG. 8.

In the following Examples, as an example, $BaTiO_3$ is used as the perovskite-type piezoelectric ceramic $ABO_3$.

Example 1

In $xBiFeO_3$-$(1-x)BaTiO_3$ ($0 \le x \le 1$), the production of a piezoelectric ceramic, in which x=0.7, is performed as described below.

$BiFeO_3$ powder was obtained as follows. Bismuth oxide and ferric oxide powder are subjected to weighing to obtain the same molar amount, and mixed thereafter. Bi has a high vapor pressure, and hence there is a fear of a shortage of Bi. As a result, it is preferred to add an excessive amount of Bi than the above-mentioned molar ratio. Next, the mixture is subjected to calcination for five hours at temperatures of from 500° C. to 700° C. under an atmospheric environment within an alumina crucible using an electric furnace. After that, after grinding the calcination powder within a mortar, the calcination was carried out again for five hours at temperatures of from 500° C. to 700° C. under an atmospheric environment.

As the $BaTiO_3$ powder, BT01 (manufactured by Sakai Chemical) having an average particle diameter of 100 nm was used. The above-mentioned $BiFeO_3$ powder and $BaTiO_3$ powder are subjected to weighing to obtain a molar ratio of x=0.7. Then, pure water, a dispersing material (Dispersant 5020, manufactured by Sannopco Co.), and Zr beads are charged into a pot followed with mixing for two hours or more. After the mixing, vacuum degassing was carried out to obtain the slurry. The slurry has a solid concentration of the powder of 60 wt %, and the concentration of the dispersing agent is adjusted so that the concentration becomes 2 wt % with respect to the solid content.

For the orientation step, a superconductive magnet (JMTD-10T180: manufactured by Japan Superconductor Technology) was used. 10 T of the magnetic field was generated by the superconductive magnet. The formation was performed by casting. For the casting, a plaster mold was used. As the plaster mold, there was used a rectangular parallelepiped body made of a plaster having a top surface of 50 mm×50 mm and a height of 30 mm, in which a cylindrical-shape hole is provided vertically with a diameter of 24 mm and a depth of 10 mm on the top surface thereof. In the magnetic field, the slurry was cast into the cylindrical hole of the plaster mold, and the plaster mold was allowed to stand still in the magnetic field until the slurry was dried. The plaster mold was left at rest so that the top surface of the plaster mold becomes perpendicular to a gravity direction. The magnetic field was applied in the vertical direction to the top surface of the plaster mold. As described above. the slurry was dried to obtain a disk-shaped compact body.

The sintering of the compact body was carried out for five hours at a temperature of 1030° C. under atmospheric environment by using an electric furnace, to thereby obtain a sintered body of the piezoelectric ceramic having 14 mmΦ and thickness of 1 mm. Here, the density of the obtained sintered body was evaluated by an Archimedian method. Further, it is preferred that the obtained sintered body be polished, for example, by determining the {110} cubic plane using the back Laue method. Then, when the electrodes are formed on the polished surface of the polished (110) cubic oriented sintered body, the component of electric field vector to be applied in the (110) cubic orientation direction of the piezoelectric material is increased, thereby being capable of obtaining more satisfactory piezoelectric characteristics. After polishing as described above, the structural analysis of the sintered body was carried out by the XRD, and the Lotgering factor F of the {110} cubic plane was calculated.

Examples 2 to 5

In $xBiFeO_3$-$(1-x)BaTiO_3$ $(0 \le x \le 1)$, the productions of the sintered bodies are conducted as in Example 1 at sintering temperatures shown in Table 1.

Comparative Examples 1 and 2

In $xBiFeO_3$-$(1-x)BaTiO_3$ $(0 \le x \le 1)$, the sintered bodies are obtained, as in Example 1, in accordance with production conditions shown in Table 1.

Comparative Examples 3 to 9

In $xBiFeO_3$-$(1-x)BaTiO_3$ $(0 \le x \le 1)$, as in Example 1 but without orientation treatment, the sintered bodies are obtained in accordance with production conditions as shown in Table 1.

Example 6

In $xBiFeO_3$-$(1-x)BaTiO_3(0 \le x \le 1)$, the production of the piezoelectric ceramics, in which x=0.7, was performed by subjecting $BiFeO_3$ and $BaTiO_3$ to calcination as described below, followed by being dissolved and then being subjected to the orientation step.

Figure 4:
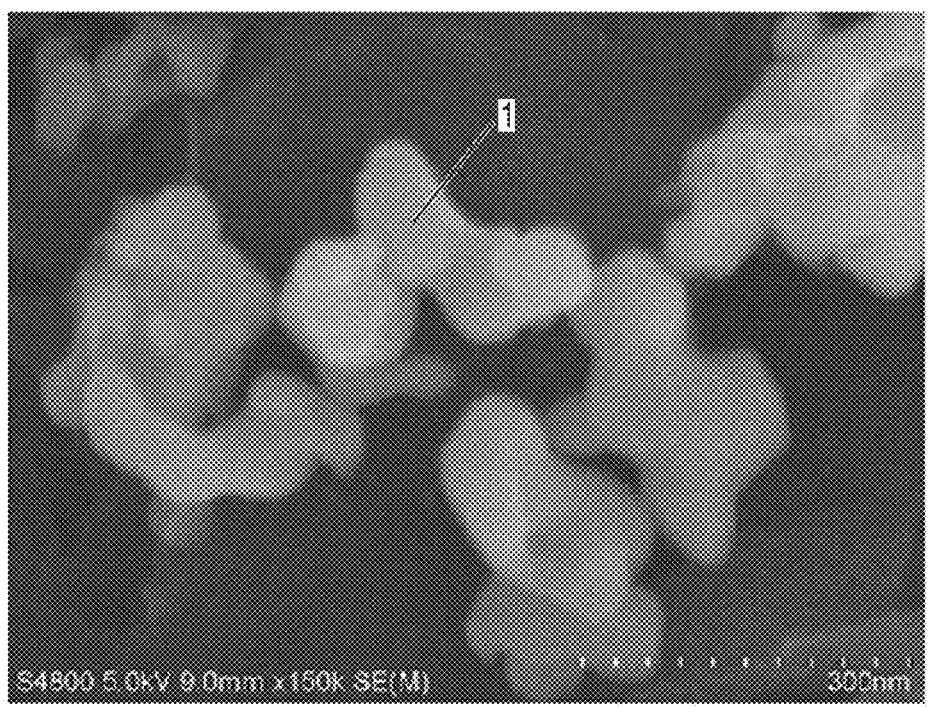
FIG. 4 is an SEM photograph of calcination powder of $0.7BiFeO_3$-$0.3BaTiO_3$.

Bismuth oxide and iron oxide powder and $BaTiO_3$ were subjected to weighing so as to obtain a molar ratio of x=0.7, and mixed thereafter. Bi has a high vapor pressure, and hence there is a fear of a shortage of Bi. Accordingly, it is preferred to add an excessive amount of Bi than the above-mentioned molar ratio. As the $BaTiO_3$, BT01 manufactured by Sakai Chemical (average particle diameter of 100 nm) was used. After that, as in Example 1, the calcination is performed to obtain the calcination powder. FIG. 4 shows an SEM photograph of the calcination powder. It can be seen that the particle diameters of the calcination powder are distributed within a range of from 300 nm to 6 μm, and each has an isotropic shape. The calcination powder was dispersed in pure water, as in Example 1, to obtain the slurry. The slurry was used, and was subjected to, as in Example 1, the orientation step, sintering, and polishing. The Lotgering factor F of the {110} cubic plane and the density were determined in the same manner as in Example 1.

Examples 7 to 9

In $xBiFeO_3$-$(1-x)BaTiO_3(0 \le x \le 1)$, the productions of the sintered bodies were conducted at sintering temperatures shown in Table 3 in the same manner as in Example 6.

Comparative Examples 10 and 11

In $xBiFeO_3$-$(1-x)BaTiO_3(0 \le x \le 1)$, the sintered bodies were obtained, as in Example 6, in accordance with the production conditions shown in Table 3.

Comparative Examples 12 to 17

In $xBiFeO_3$-$(1-x)BaTiO_3(0 \le x \le 1)$, as in Example 6 but without the orientation step, the sintered bodies were obtained in accordance with the production conditions shown in Table 3.

Figure 1B:
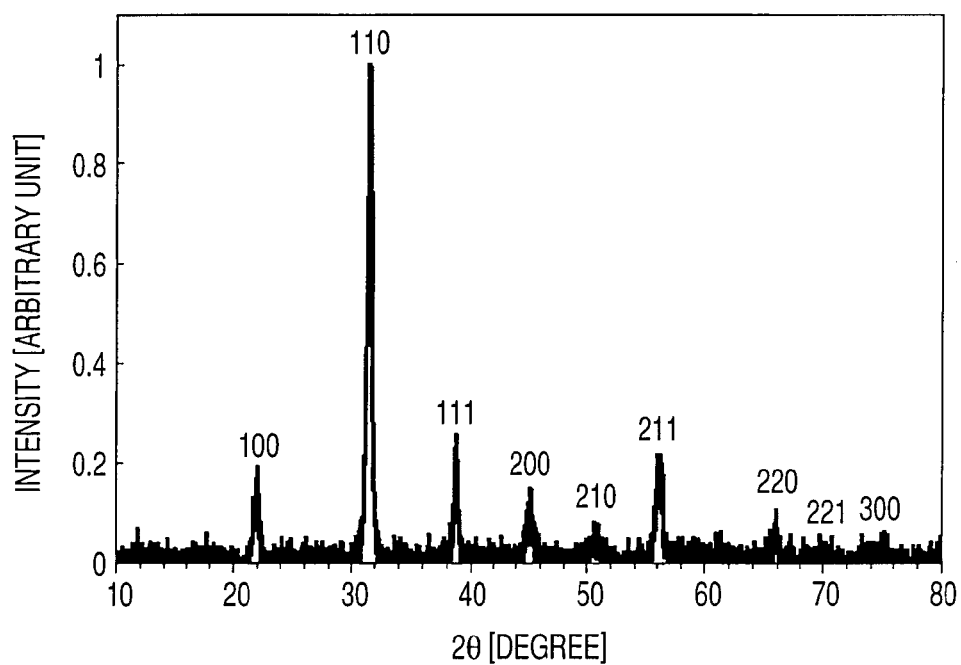

The XRD results of the oriented sintered body in Example 1 and the non-oriented sintered body in Comparative Example 3 are illustrated in FIGS. 1A and 1B. FIG. 1A is the XRD of Example 1, and FIG. 1B is the XRD of Comparative Example 3. From those XRD results, the Lotgering factor F of a {110} cubic plane in Example 1 is determined. The Lotgering factor F and the relative density are shown in Table 2.

Figure 5:
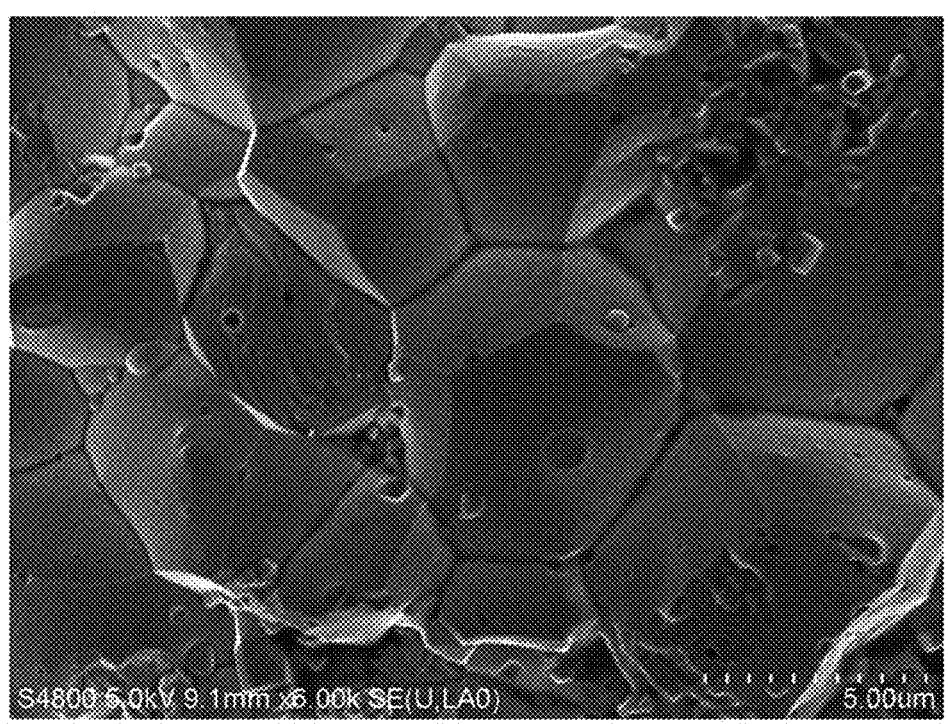
FIG. 5 is a sectional SEM photograph of (110) cubic oriented piezoelectric ceramic ($0.7BiFeO_3$-$0.3BaTiO_3$)

A sectional SEM photograph of the oriented sintered body is shown in FIG. 5. It is observed that an average grain diameter of the oriented sintered body is 6 μm.

The Lotgering factors F of a {110} cubic plane in Examples 2 to 5 are determined from the results of the XRD in Examples 2 to 5 and from the respective results of the XRD in Comparative Examples 4 to 7. Those Lotgering factors F of a {110} cubic plane and relative densities, and a distortion at a time of electric field application (40 kV/cm) are shown in Table 2.

The Lotgering factors F of a {110} cubic plane in Comparative Examples 1 and 2 are determined from the results of the XRD in Comparative Examples 1 and 2 and from the respective results of the XRD in Comparative Examples 8 and 9. Those Lotgering factors F of a {110} cubic plane and relative densities are shown in Table 2.

Figure 2:
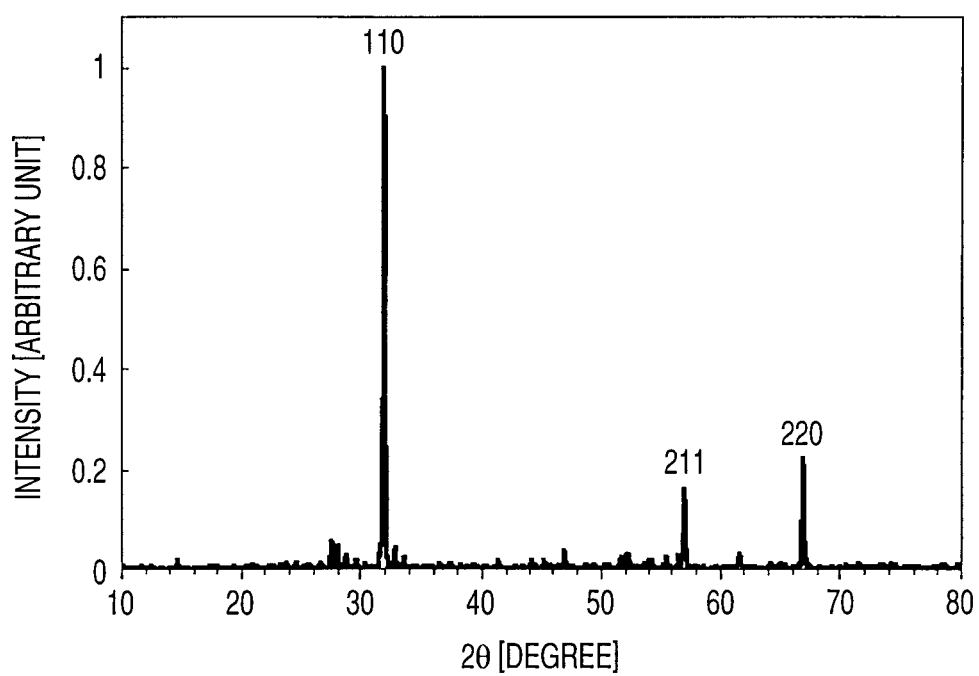
FIG. 2 is a graph illustrating the XRD of an oriented sintered body of a ceramic of $BiFeO_3$ according to Example 2 of the present invention, which is oriented in the magnetic field of 10 T.

FIG. 2 illustrates the XRD results in Example 2. From FIG. 2, it was found that not only the (110) cubic orientation, but also a (211) cubic orientation is included.

Figure 3A:
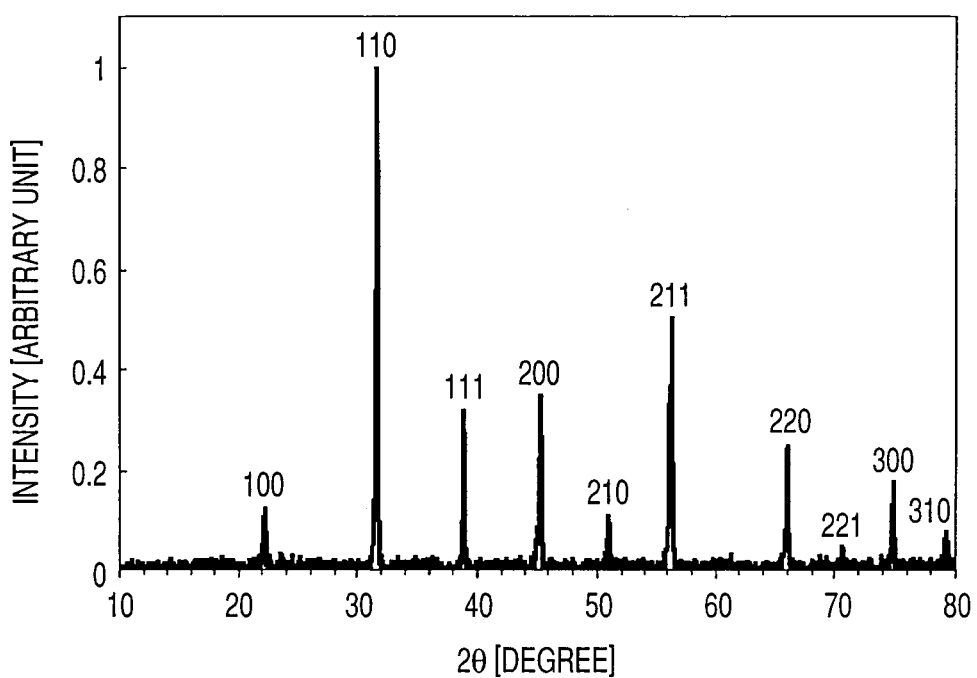
FIGS. 3A and 3B are graphs illustrating the XRD of the oriented sintered body and the non-oriented sintered body (Comparative Example 1 and Comparative Example 8)
Figure 3B:
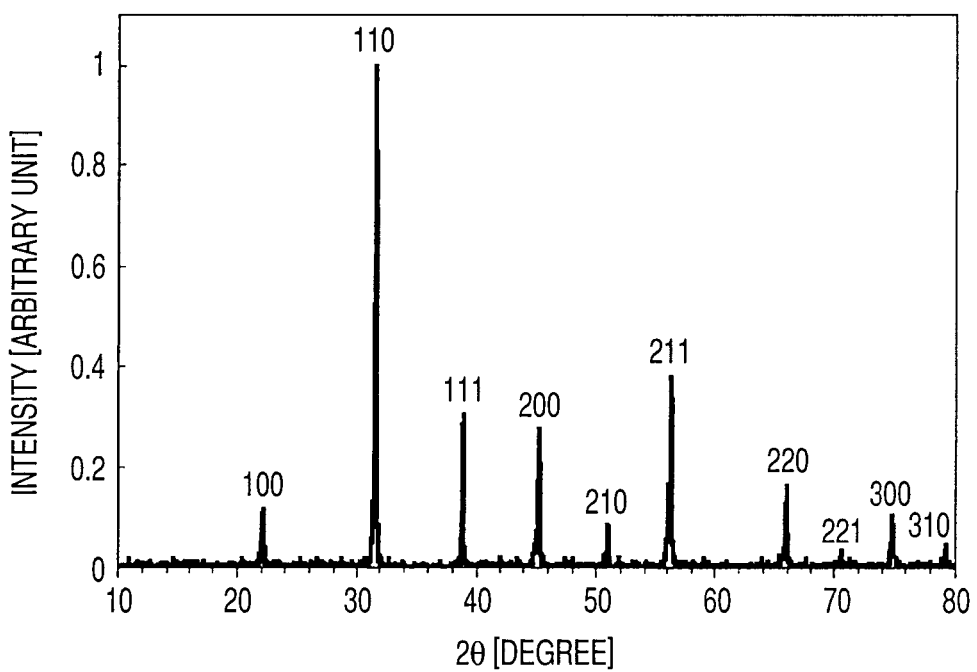

The XRD results of Comparative Example 1 and Comparative Example 8 are illustrated in FIGS. 3A and 3B. FIG. 3A is an XRD of Comparative Example 1. FIG. 3B is an XRD of Comparative Example 8.

On the {110} planes in Examples 1 to 5, gold electrodes each having a thickness of 100 nm are provided, to thereby obtain the piezoelectric device of the present invention. After poling, distortion was evaluated when 40 kV/cm of electric field was applied to those piezoelectric devices. The results of distortion were shown in Table 2.

In Comparative Examples 1 to 9, 100 nm thickness of the gold electrodes are provided, thereby obtaining the piezoelectric device. After poling, the distortion at the time of the application of 40 kV/cm electric field to those piezoelectric devices were measured at room temperature (25° C.) by a laser Doppler method. The measurement results of the distortion were shown in Table 2.

The Lotgering factors F, relative densities, and distortions of the {110} cubic plane according to Examples 6 to 9 were obtained in the same manner as in Example 1. The results are shown in Table 4.

The Lotgering factors F, relative densities, and distortions of the {110} cubic plane according to Comparative Examples 10 to 17 were obtained in the same manner as in Comparative Example 1. The results are shown in Table 4.

TABLE 1

|  | X | Sintering Temperature (° C.) | Orientation Processing |
|---|---|---|---|
| Example 1 | 0.7 | 1030 | yes |
| Example 2 | 1 | 800 | yes |
| Example 3 | 0.3 | 1140 | yes |
| Example 4 | 0.9 | 970 | yes |
| Example 5 | 0.5 | 1085 | yes |
| Comparative Example 1 | 0.2 | 1170 | yes |
| Comparative Example 2 | 0.1 | 1200 | yes |
| Comparative Example 3 | 0.7 | 1030 | no |
| Comparative Example 4 | 1 | 800 | no |
| Comparative Example 5 | 0.3 | 1140 | no |
| Comparative Example 6 | 0.9 | 970 | no |
| Comparative Example 7 | 0.5 | 1085 | no |
| Comparative Example 8 | 0.2 | 1170 | no |
| Comparative Example 9 | 0.1 | 1200 | no |

TABLE 2

|  | X | F [%] | Relative Density [%] | Distortion [%] |
|---|---|---|---|---|
| Example 1 | 0.7 | 74 | 94 | 0.037 |
| Example 2 | 1 | 73 | 85 | 0.022 |
| Example 3 | 0.3 | 17 | 97 | 0.033 |
| Example 4 | 0.9 | 67 | 87 | 0.037 |
| Example 5 | 0.5 | 53 | 90 | 0.036 |
| Comparative Example 1 | 0.2 | −16 | 97 | 0.013 |
| Comparative Example 2 | 0.1 | 0.4 | 95 | 0.011 |
| Comparative Example 3 | 0.7 | no orientation | 93 | 0.026 |
| Comparative Example 4 | 1 | no orientation | 86 | 0.018 |
| Comparative Example 5 | 0.3 | no orientation | 95 | 0.026 |
| Comparative Example 6 | 0.9 | no orientation | 85 | 0.025 |
| Comparative Example 7 | 0.5 | no orientation | 91 | 0.026 |
| Comparative Example 8 | 0.2 | no orientation | 92 | 0.014 |
| Comparative Example 9 | 0.1 | no orientation | 90 | 0.010 |

TABLE 3

|  | X | Sintering Temperature (° C.) | Orientation Processing |
|---|---|---|---|
| Example 6 | 0.7 | 1030 | yes |
| Example 7 | 0.3 | 1140 | yes |
| Example 8 | 0.9 | 970 | yes |
| Example 9 | 0.5 | 1085 | yes |
| Comparative Example 10 | 0.2 | 1170 | yes |
| Comparative Example 11 | 0.1 | 1200 | yes |
| Comparative Example 12 | 0.7 | 1030 | no |
| Comparative Example 13 | 0.3 | 1140 | no |
| Comparative Example 14 | 0.9 | 970 | no |
| Comparative Example 15 | 0.5 | 1085 | no |
| Comparative Example 16 | 0.2 | 1170 | no |
| Comparative Example 17 | 0.1 | 1200 | no |

TABLE 4

|  | X | F [%] | Relative Density [%] | Distortion [%] |
|---|---|---|---|---|
| Example 6 | 0.7 | 96 | 95 | 0.041 |
| Example 7 | 0.3 | 34 | 98 | 0.034 |
| Example 8 | 0.9 | 76 | 89 | 0.039 |
| Example 9 | 0.5 | 69 | 92 | 0.037 |
| Comparative Example 10 | 0.2 | −14 | 96 | 0.011 |
| Comparative Example 11 | 0.1 | 0.3 | 96 | 0.011 |
| Comparative Example 12 | 0.7 | no orientation | 92 | 0.025 |
| Comparative Example 13 | 0.3 | no orientation | 96 | 0.027 |
| Comparative Example 14 | 0.9 | no orientation | 80 | 0.025 |
| Comparative Example 15 | 0.5 | no orientation | 91 | 0.025 |
| Comparative Example 16 | 0.2 | no orientation | 91 | 0.013 |
| Comparative Example 17 | 0.1 | no orientation | 90 | 0.010 |

As described above, from Table 2, it is observed that the Lotgering factors F of a {110} cubic plane are within a range of $0.3 \leq x \leq 1$, and the Lotgering factors F of a {110} cubic plane in Examples 1 to 5 exceed 10%, and the relative densities exceed 85%. From the above-mentioned results, it is observed that a preferred range of x is within a range of 0.3≤x≤1.

From Table 2, 20% or more of increases in distortion were observed by comparing Examples 1 to 5 and Comparative Examples 3 to 7, respectively. In particular, the rate of increase of the distortion when x=0.5 to 0.9 was 30% or more. Consequently, it can be seen that there is such an effect that the piezoelectric property of the piezoelectric ceramics according to the present invention is improved by the (110) cubic orientation. The sintered bodies obtained in the Comparative Examples are polycrystalline materials having no specific orientation.

From Table 4, it can be seen that, even in the case where the orientation step was performed after subjecting BiFeO3 and BaTiO$_3$ to calcination, as in Examples 1 to 5, the Lotgering factors F of the {110} cubic plane in Examples 6 to 9 exceed 10% within the range of 0.3≤x≤1, and the relative densities exceed 85%. From the above-mentioned results, it can be seen that the preferred range of x is within a range of 0.3≤x≤1.

From Table 4, 20% or more of increases in distortion were observed by comparing Examples 6 to 9 and Comparative Examples 12 to 15, respectively. In particular, the rate of increase of the distortion when x=0.5 to 0.9 was 30% or more. Consequently, it can be seen that there is such an effect that the piezoelectric property of the piezoelectric ceramics according to the present invention is improved by the (110) cubic orientation. The sintered bodies for comparison are polycrystalline materials having no specific orientation.

From Table 2 and Table 4, it can be said that it is more preferred that the orientation process be performed after subjecting BiFeO$_3$ and BaTiO$_3$ to calcination, because higher Lotgering factor F, higher relative density, and higher distortion are available.

In the composition where x=0.5 or more, even in a case where the magnetic field is lowered from 10 T to 1 T, similar (110) cubic oriented piezoelectric ceramic and piezoelectric device could be obtained.

Example 10

In xBiFeO$_3$-(1–x)AgNbO$_3$(0≤x≤1), production of the piezoelectric ceramics, in which x=0.8, was performed as follows.

In the same manner as in Example 1, the calcination powder of BiFeO$_3$ was obtained.

The calcination powder of AgNbO$_3$ was obtained as below. Silver (I) oxide and niobium pentoxide were subjected to weighing so that silver and niobium becomes the same molar amount, and mixed thereafter. Next, the mixture was subjected to calcination for four hours at temperatures of from 900° C. to 1000° C. under an atmospheric environment within an alumina crucible using an electric furnace. After that, after grinding the calcination powder within a mortar, the calcination was carried out again for seven hours at temperatures of from 900° C. to 1000° C. under an atmospheric environment using an electric furnace. The above-mentioned BiFeO$_3$ calcination powder and AgNbO$_3$ calcination powder were subjected to weighing so as to obtain a molar ratio of x=0.8, and the slurry was obtained as in Example 1. The slurry was subjected to the orientation step as in Example 1 to thereby obtain a compact body. The obtained compact body was sintered as in Example 1, thereby obtaining the sintered body. The sintering temperature was 1000° C. The structural analysis of the sintered body was carried out by the XRD in the same manner as in Example 1, and the (110) cubic orientation was observed. The Lotgering factor F of the {110} cubic plane was 66%.

Example 11

In xBiFeO$_3$-(1–x)BiCoO$_3$(0≤x≤1), production of the piezoelectric ceramics, in which x=0.9, was performed as follows.

Bismuth oxide, iron oxide powder, and tricobalt tetroxide were subjected to weighing so as to obtain the molar ratio of x=0.9, and mixed. Bi has a high vapor pressure, and hence there is a fear of a shortage of Bi. As a result, it is preferred to add an excessive amount of Bi than the above-mentioned molar ratio. After that, the calcination was performed as in Example 1, to thereby obtain the calcination powder. The sintering temperature was from 600° C. to 800° C. The calcination powder was dispersed within pure water as in Example 1, to thereby obtain the slurry. The orientation step was performed using the slurry as in Example 1, and was sintered. The sintering temperature was 850° C. The structural analysis of the sintered body was carried out by the XRD in the same manner as in Example 1, and the (110) cubic orientation was observed. The Lotgering factor F of the {110} cubic plane was 71%.

From Examples 11 and 12, as the perovskite-type piezoelectric ceramic ABO$_3$ represented by the general formula (1), even in a case where the above-mentioned materials are used other than BaTiO$_3$, similarly, the (110) cubic piezoelectric ceramic could be produced.

As the perovskite-type piezoelectric ceramic ABO$_3$ represented by the general formula (1), even in a case where the above-mentioned materials are used other than BaTiO$_3$, similarly, the (110) cubic oriented piezoelectric ceramic could be produced.

As the piezoelectric ceramic of the present invention contains BiFeO$_3$ having a {110} plane orientation in the pseudo-cubic form, which is suited for the domain engineering, the piezoelectric ceramic may be applicable to the piezoelectric device and a piezoelectric sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-087240, filed Mar. 31, 2009, which is hereby incorporated by reference herein in its entirety.

The invention claimed is:

1. A ceramic having a {110} plane orientation in a pseudo-cubic form, which comprises a perovskite-type metal oxide represented by general formula (1):

$x$BiFeO$_3$-(1–$x$)ABO$_3$         (1),

where A represents at least one kind of a metal ion having a valence of 1, 2 or 3; and B represents at least one kind of a metal ion having a valence of 3, 4, or 5, provided that x is within a range of 0.3≤x≤1,
wherein a {110}-oriented portion of the ceramic has a thickness of 50 μm or more.

2. The ceramic according to claim 1, wherein a Lotgering factor F of a {110} plane in the pseudo-cubic form is from 10% or to 100%.

3. A piezoelectric device, comprising the ceramic according to claim 1 and a pair of electrodes provided on the ceramic.

4. The piezoelectric device according to claim 3, wherein the electrodes sandwich the ceramic and are in parallel with a {110} orientation plane in a pseudo-cubic form.

5. A method of producing a piezoelectric device, comprising:
- a slurry step of obtaining a ceramic slurry comprising a ceramic powder comprising a perovskite-type metal oxide represented by general formula (1);
- an orientation step of forming the ceramic slurry in a magnetic field to obtain an oriented ceramic compact body;
- a sintering step of sintering the ceramic compact body to obtain a ceramic sintered body; and
- an electrode formation step of forming a pair of electrodes on the ceramic sintered body,
- wherein the ceramic powder in the slurry step contains 30 mol % or more of $BiFeO_3$, which is dissolved or mixed:

$$x BiFeO_3\text{-}(1-x)ABO_3 \quad (1),$$

where A represents at least one kind of a metal ion having a valence of 1, 2 or 3; and B represents at least one kind of a metal ion having a valence of 3, 4, or 5, provided that x is within a range of $0.3 \leq x \leq 1$.

6. The ceramic according to claim 1, wherein x is within a range of $0.3 \leq x \leq 0.9$.

* * * * *